(12) United States Patent
Jin et al.

(10) Patent No.: US 6,862,714 B2
(45) Date of Patent: Mar. 1, 2005

(54) ACCURATELY TUNING RESISTORS

(75) Inventors: Robert X. Jin, San Jose, CA (US); Vivian Hu, Union City, CA (US); Stephen F. Dreyer, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 243 days.

(21) Appl. No.: 10/126,402

(22) Filed: Apr. 19, 2002

(65) Prior Publication Data

US 2003/0200514 A1 Oct. 23, 2003

(51) Int. Cl.[7] .......................... G06F 17/50; G06F 9/45; H03H 7/38; H01P 5/08
(52) U.S. Cl. .................. 716/1; 716/2; 716/5; 716/9; 716/10; 716/12; 333/130; 333/17.3; 333/32
(58) Field of Search ................ 716/1, 2, 4, 5, 716/8–16; 333/124, 130, 17.3, 32

(56) References Cited

U.S. PATENT DOCUMENTS 5,398,261 A * 3/1995 Marbot ....................... 375/257
6,628,223 B2 * 9/2003 Nagano ....................... 341/155
2003/0102932 A1 * 6/2003 Lee et al. .................. 333/17.3

OTHER PUBLICATIONS

DeHon et al., "Automatic Impedance Control," 1993 IEEE Int'l Solid–State Circuits Conference, pp. 164–165, 283.*

Trotter et al., "A COMS Low Voltage High Performance Interface," 1994 7th Annual IEEE Int'l ASIC Conference and Exhibit, pp. 44–48.*

* cited by examiner

Primary Examiner—Leigh M. Garbowski
(74) Attorney, Agent, or Firm—Trop, Pruner & Hu, P.C.

(57) ABSTRACT

Resistors may be more accurately tuned by using an external resistor and comparing the value of an internal resistor to the value of the external resistor. The value of the internal resistor may be adjusted to match the value of the external resistor. Any number of on-chip resistors may then be matched and adjusted using the information obtained with respect to the first internal resistor.

30 Claims, 2 Drawing Sheets

ACCURATELY TUNING RESISTORS

BACKGROUND

This invention relates generally to tuning resistors to produce more accurate resistors.

Termination impedances are often used at the transmit and receiving ends of devices passing high speed electrical signals over a transmission line media to reduce reflections and the subsequent signal degradation caused by those reflections. Reflections may degrade the signals at both the transmitter and receiver. The closer the termination impedance matches the impedance of the transmission line, the smaller the reflections. The reflections increase as the speed of the signals gets higher relative to the round trip delay of the media.

Termination resistors are sometimes implemented on integrated circuits to minimize these reflections when high speed signals are being transmitted or received. Accurately matching the termination resistors to the value of the impedance of the attached transmission line reduces reflections and resultant signal degradation. Thus, it is desirable that the termination resistor be very accurate across a range of temperatures and power supply voltages.

Termination resistors may be implemented in commonly available integrated circuit technologies materials such as in a diffusion, polysilicon, or metal. The resulting resistors are not very accurate and vary substantially with temperature and power supply voltage. This variation in resistance may result in a significant mismatch between the on-chip termination resistor and off chip transmission line, and hence significant reflections may result. This level of signal degradation may not be acceptable in some applications.

One method used to make more accurate termination resistors on an integrated circuit is to use an integrated circuit process that makes very accurate resistive elements. However, making accurate resistor elements using integrated circuit process techniques substantially increases the cost of the process.

A second method to implement more accurate termination resistors on an integrated circuit is to trim an inaccurate resistor to an accurate value. This can be done by fuse trimming or laser trimming the resistor to the desired value at manufacturing. The drawback of this approach is that it consumes silicon area and only adjusts absolute value. This approach is not able to compensate for resistor variations with temperature and power supply voltage.

Thus, there is a need for better ways to improve the accuracy of resistors.

DETAILED DESCRIPTION

In accordance with one embodiment of the present invention, a typical on-chip resistor may automatically be adjusted to an accurate value across a broad range of manufacturing processes, temperatures, and power supply voltages. In one embodiment, an accurate on-chip termination resistor may be provided. However, the present invention is applicable to more accurate resistors for any application.

Figure 1:
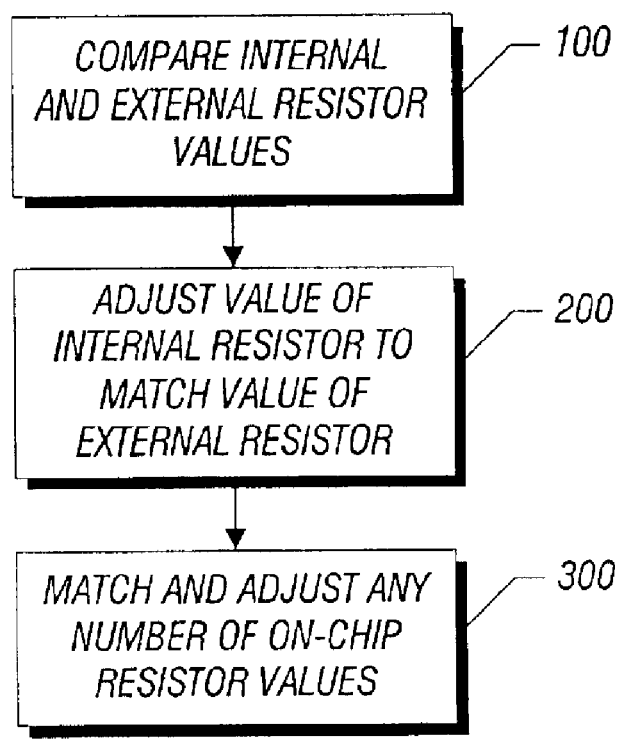
FIG. 1 is a flow for one embodiment of the present invention.

In one embodiment, shown in FIG. 1, an internal resistor value is compared to an external resistor value as indicated at block 100. Then the value of the internal resistor is adjusted digitally to match the value of the external resistor as indicated in block 200. Those digitally adjusted resistor values may then be used to adjust the value of another on-chip resistor as indicated in block 300. The internal resistor may then be as accurate as the external resistor, given an ideal circuit.

Figure 2:
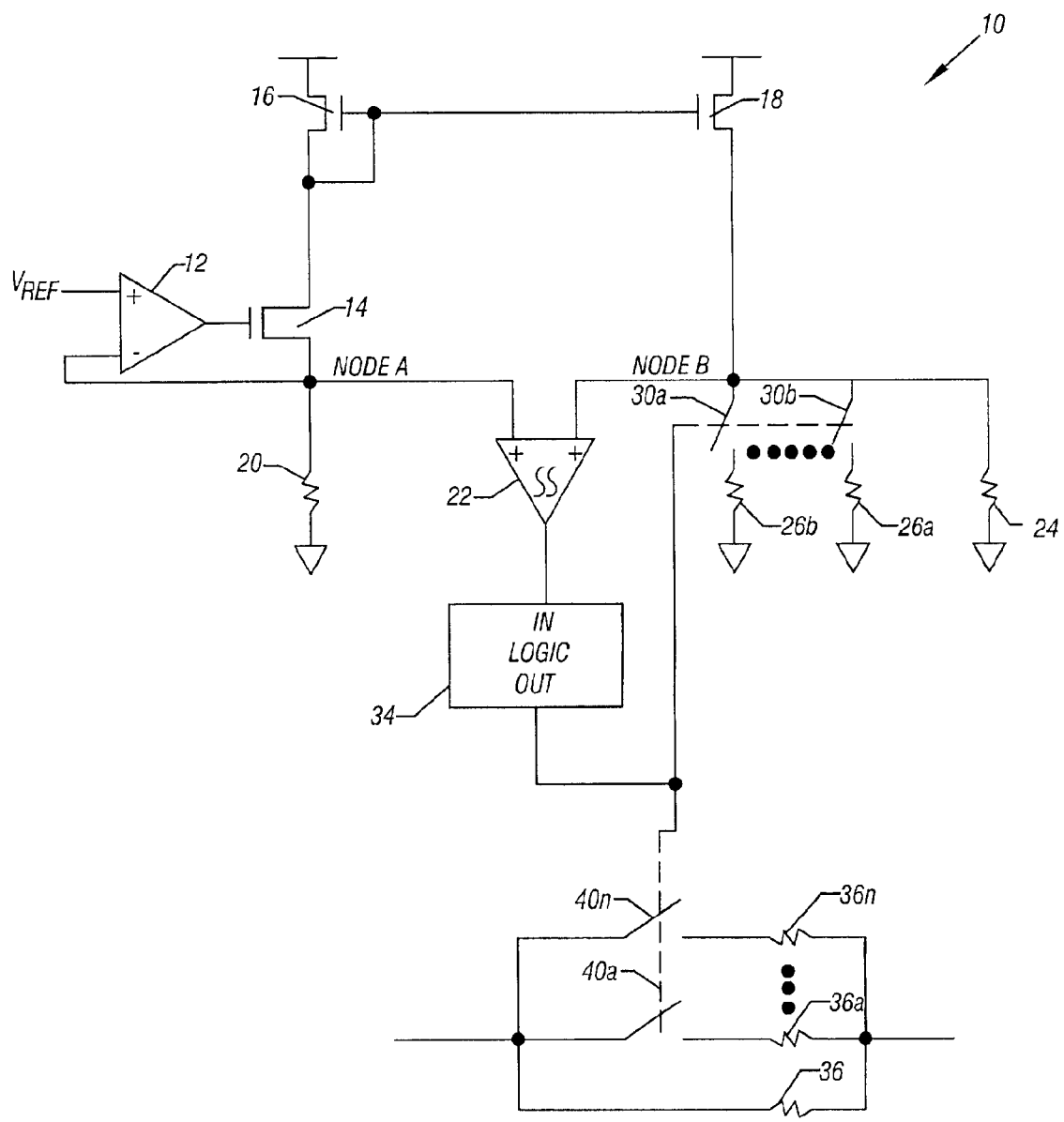
FIG. 2 is a circuit diagram in accordance with one embodiment of the present invention.

The method is further illustrated using the equivalent circuit 10 shown in FIG. 2. Assume that the voltage on node B starts at a higher voltage than that of node A and the switches 30 in series with the internal resistors 26 are all open. The combination of the amplifier 12 and the transistor 14 causes the amplifier 12 reference voltage (Vref) to be impressed across the external resistor 20 on the node A. The reference voltage Vref can come from any source; in one embodiment, it may be generated by a bandgap reference circuit. The current in the external resistor 20 is then equal to the voltage Vref divided by the resistance (Rext) of the external resistor 20 (Vref/Rext). This same current flows in transistor 16 in series with the transistor 14.

Since the transistors 16 and 18 are arranged as a current mirror, the same current flows through the transistors 16 and 18 as well as the internal resistor 24 having a resistance Rint. Thus, the voltage on node B is Vref*(Rint/Rext).

The comparator 22 then compares the voltages of nodes A and B and sends the result to the logic block 34. If the voltage of node B is greater than the voltage of node A, the logic block 34 increments a digital output value of SW[n:0] by one count. This signal closes the switch 30b on resistor 24a having a resistance Rint0 decreasing the total resistance across node B to the resistance of the resistors 24 and 26a. As a result, the voltage at node B decreases to Vref*((Rint+Rint0)/Rext).

If the voltage on node B is still greater than the voltage on node A, the process continues switching in more resistors 26 using switches 30 until the voltage on node B is less than the voltage on node A. When this point is reached, the process stops and the voltages and digital values on the SW[n:0] stay constant unless the value of an internal resistor changes. The hysteresis in the comparator 22 prevents the circuit 10 from toggling between two values and offers some noise immunity.

The digital value SW[n:0] then can be distributed to another part of the chip and used to adjust any number of on-chip resistors, made by the same process such as the resistor 36. If the internal resistor 36 was made by the same process to have the same value as the resistor 24, the same digital values SW[n:0] may be used again to set the second internal resistance value using the resistors 36a–n and switches 40a–n.

The value of the equivalent resistor formed with the resistors 36 and 36a–n is as accurate as the external resistor 20, assuming ideal circuit elements and an infinite array of switches/resistors. In practical applications, the circuit 10 error and a finite switch/resistor array can achieve a value for a termination resistor 36, 36a–n to be within 5% of the external resistor 20 value in some embodiments. This is much better than can be achieved with normal resistor elements.

While the above description refers to a way to adjust a termination resistor to accurate value, the present invention is not limited to termination resistors and can be used to make any resistor more accurate.

In one embodiment all of the components shown in FIG. 2, except the external resistor 20, are integrated in the same integrated circuit. A connection may be made to the external resistor 20 through a pin at node A.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

progressively switching additional resistors in parallel with an internal resistor on an integrated circuit until the voltage on a node associated with an external resistor, external to said circuit, is greater than the voltage on a node associated with the internal resistor.

2. The method of claim 1 further comprising:

comparing the values of the internal resistor to the external resistor;

adjusting the value of the internal resistor to match the value of the external resistor; and match and adjust the value of another resistor on the same integrated circuit.

3. The method of claim 2 including selectively switching in additional internal resistors in parallel to match the value of the external resistor.

4. The method of claim 3 including comparing the voltages across the internal and external resistors.

5. The method of claim 4 including adjusting the amount of resistance associated with the internal resistor based on the comparison of a voltage between a node associated with the internal resistor and a node associated with the external resistor.

6. The method of claim 5 including causing the same transistor current to flow through the internal and external resistors.

7. The method of claim 6 including placing the internal and external resistors in a current mirror arrangement.

8. The method of claim 7 including comparing the voltage on a node associated with the internal resistor and a voltage on a node associated with an external resistor using a comparator having hysteresis.

9. The method of claim 8 including developing a digital value indicative of the number of additional resistors that are switched in parallel with the internal resistor.

10. The method of claim 9 including using said digital value to adjust the resistance value of another internal resistor.

11. A circuit comprising:

a voltage reference coupled to a first node;

an internal resistor coupled to a second node;

a comparator coupled to said first and second nodes;

a switching network including switches and resistors, said network to selectively couple resistors in parallel to said internal resistor, said switching network coupled to said comparator.

12. The circuit of claim 11 wherein said first and second nodes are coupled in a current mirror.

13. The circuit of claim 11 wherein said comparator is coupled to logic that generates a signal to control the switching network to add additional resistors in parallel to said internal resistor.

14. The circuit of claim 13 wherein said switching network includes a plurality of parallel resistors each coupled in series with a switch in turn coupled to said logic.

15. The circuit of claim 11 wherein said circuit is an integrated circuit including at least two internal resistors each associated with a switching network.

16. The circuit of claim 15 wherein said integrated circuit also includes said logic and said comparator.

17. The circuit of claim 16 wherein said integrated circuit includes said current mirror and said nodes.

18. The circuit of claim 17 wherein said reference voltage is generated by a bandgap reference circuit.

19. An integrated circuit comprising:

a first node;

an internal resistor coupled to said first node;

a second node connectable to an external resistor;

a comparator to compare the voltages on said first and second nodes;

logic coupled to said comparator; and a switching network to selectively couple one or more resistors in parallel to said internal resistor, said switching network coupled to said logic.

20. The integrated circuit of claim 19 including a current mirror coupled to said first and second nodes.

21. The circuit of claim 19 wherein said logic generates a signal to control the switching network to add additional resistors in parallel to said internal resistor.

22. The circuit of claim 21 wherein said switching network includes a plurality of parallel resistors each coupled in series with a switch in turn coupled to said logic.

23. The circuit of claim 19 including two internal resistors each associated with a switching network.

24. The circuit of claim 23 including a separate switching network for each of at least two internal resistors, each switching network coupled to said logic.

25. The integrated circuit of claim 19 including a reference voltage circuit coupled to said second node.

26. The circuit of claim 25 wherein said reference voltage circuit is a bandgap reference circuit.

27. The circuit of claim 19 wherein said logic operates a switch to connect a resistor in said network to augment the internal resistor.

28. The circuit of claim 27 wherein said comparator operates a switch if the voltage on the first node is less than the voltage on the second node.

29. The circuit of claim 28 wherein said comparator continues to operate switches until the voltage on the first node is greater than the voltage on the second node.

30. The circuit of claim 29 wherein said comparator has hysteresis to reduce toggling.

* * * * *